US012598819B2

(12) United States Patent
Reich et al.

(10) Patent No.: US 12,598,819 B2
(45) Date of Patent: Apr. 7, 2026

(54) SOLAR CELL INTERCONNECTION WIRE INTERCONNECT STRUCTURE WITH STRAIN RELIEF FEATURES

(71) Applicant: Maxeon Solar Pte. Ltd., Singapore (SG)

(72) Inventors: Matthieu Reich, San Jose, CA (US); Paul Loscutoff, Castro Valley, CA (US); Richard Sewell, Los Altos, CA (US)

(73) Assignee: Maxeon Solar Pte. Ltd., Singapore (SG)

( * ) Notice: Subject to any disclaimer, the term of this patent is extended or adjusted under 35 U.S.C. 154(b) by 73 days.

(21) Appl. No.: 18/406,084

(22) Filed: Jan. 5, 2024

(65) Prior Publication Data

US 2025/0228014 A1      Jul. 10, 2025

(51) Int. Cl.
H10F 19/90      (2025.01)

(52) U.S. Cl.
CPC .................................. H10F 19/904 (2025.01)

(58) Field of Classification Search
CPC ......... H10F 19/904; H10F 19/35; H10F 19/90
See application file for complete search history.

(56)      References Cited

U.S. PATENT DOCUMENTS

2015/0243818 A1*   8/2015   Kim ...................... H10F 19/908
136/244

* cited by examiner

*Primary Examiner* — Tae-Sik Kang
(74) *Attorney, Agent, or Firm* — Vanguard / IPLLP; Reginald Ratliff

(57)      ABSTRACT

An interconnect structure for solar cell interconnection wires is disclosed. The interconnect structure includes a first portion that is attached to parts of a plurality of wires that extend in a first direction away from a first solar cell to which the plurality of wires are coupled and a second portion that is attached to parts of the plurality of wires that extend in a second direction away from a second solar cell to which the plurality of wires are coupled. The interconnect structure also includes a flexible portion between the first portion and the second portion, that includes openings, that is configured to flex in accordance with a movement of one or more of the plurality of wires.

14 Claims, 8 Drawing Sheets

160

170

170

150

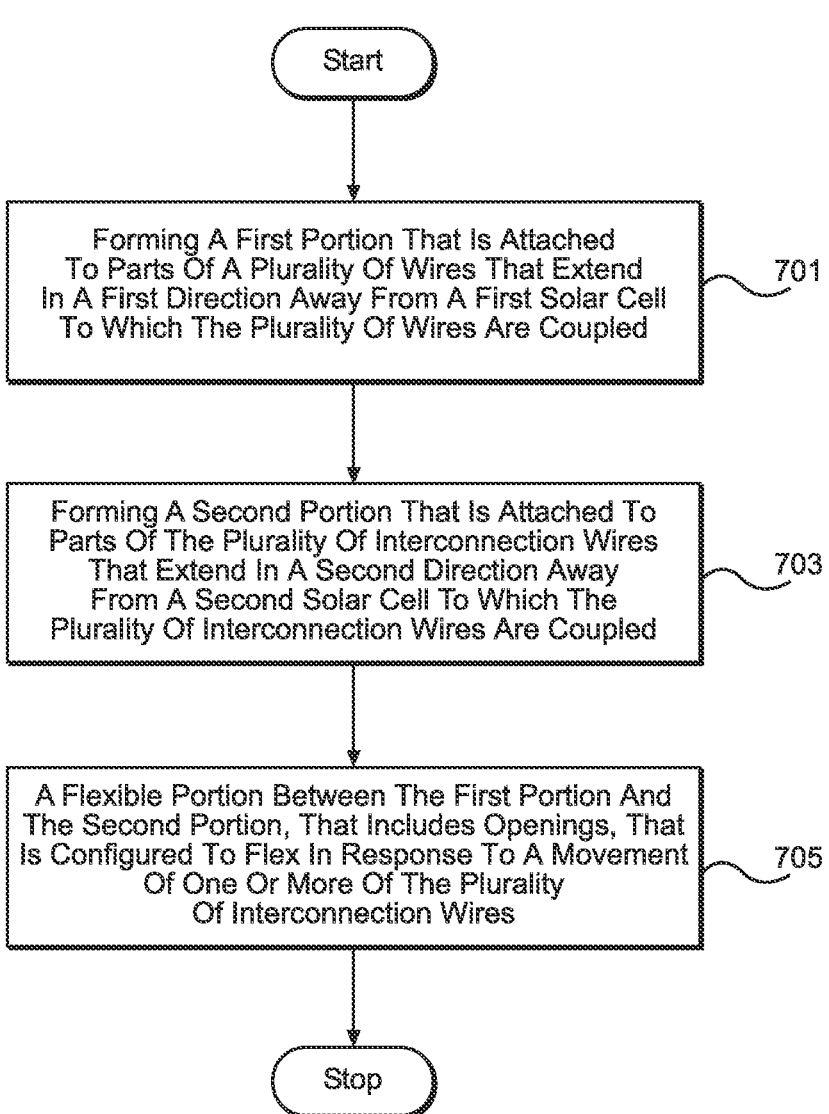

Start

Forming A First Portion That Is Attached
To Parts Of A Plurality Of Wires That Extend
In A First Direction Away From A First Solar Cell
To Which The Plurality Of Wires Are Coupled
701

Forming A Second Portion That Is Attached To
Parts Of The Plurality Of Interconnection Wires
That Extend In A Second Direction Away
From A Second Solar Cell To Which The
Plurality Of Interconnection Wires Are Coupled
703

A Flexible Portion Between The First Portion And
The Second Portion, That Includes Openings, That
Is Configured To Flex In Response To A Movement
Of One Or More Of The Plurality
Of Interconnection Wires
705

Stop

FIG. 7

SOLAR CELL INTERCONNECTION WIRE INTERCONNECT STRUCTURE WITH STRAIN RELIEF FEATURES

TECHNICAL FIELD

Embodiments of the disclosure pertain to strain relief for solar cell interconnection wires, and more particularly to a solar cell interconnection wire interconnect structure with strain relief features.

BACKGROUND

The degradation and failure of photovoltaic systems is a key factor in the cost of electricity as it reduces the operational lifetime of photovoltaic systems. Reliability can be quantitatively defined as the probability that an item will perform a required function without failure under stated conditions for a stated period. Photovoltaic modules can be exposed to various stresses that can degrade the photovoltaic modules in ways that influence their performance and long-term reliability. Causes of photovoltaic module degradation can include both external and internal stress factors. External stress factors can include but are not limited to irradiance, temperature, moisture, mechanical load, and soiling. Internal stress factors can include but are not limited to process, architecture, bill of materials, and bill of materials compatibility.

One of the many components of photovoltaic modules that can experience degradation and failure due to internal and/or external stress factors include solar cell interconnection wires. For example, solar cell interconnection wires can experience fatigue cracking due to stress factors, such as mechanical load, temperature cycling, moisture, etc. that can cause the movement of the solar cells to which they are connected and/or the movement of the solar cell interconnection wires themselves. The operational lifetime of photovoltaic modules can be diminished by such degradation. Consequently, manufacturers that seek to improve the operational lifetime of photovoltaic modules have to utilize solar cell interconnection wire designs that can satisfactorily address the effect of stress factors on solar cell interconnection wires.

BRIEF DESCRIPTION OF THE DRAWINGS

FIG. 7 shows a flowchart of a method for forming an interconnection wire interconnect structure for solar cells according to one embodiment.

DESCRIPTION OF THE EMBODIMENTS

Figure 1A:
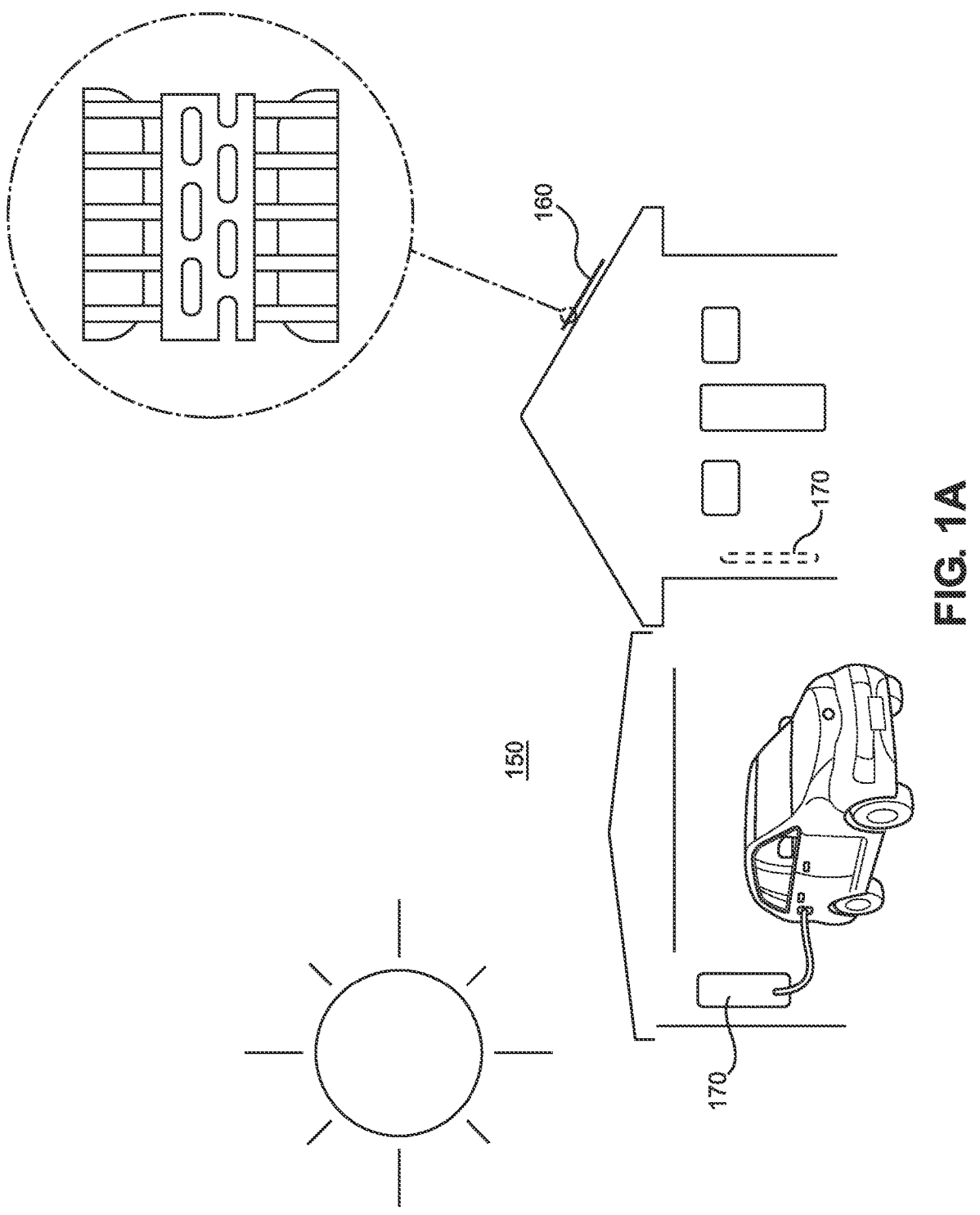
FIG. 1A illustrates an exemplary operating environment of a photovoltaic module that includes an interconnection wire interconnect structure with strain relief features according to one embodiment.

An interconnection wire interconnect structure with strain relief features is described. It should be appreciated that although embodiments are described herein with reference to example interconnection wire interconnect structure implementations, the disclosure is applicable to interconnection wire interconnect structures in general as well as other kinds of interconnection wire interconnect structure implementations. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

As used herein, the term "interconnection wires" is intended to refer to wires that connect a plurality of solar cells and collect direct current that they generate. The interconnection wires provide a pathway for the direct current that facilitates its delivery from the solar cells to an inverter which can convert it into usable alternating current.

As used herein, the term "interconnect structure" is intended to refer to a structure that is formed from a flexible and conductive sheet of material that is coupled to and connects portions of interconnection wires in the space located between solar cells. In one embodiment, the interconnect structure is designed to have the capacity to bend, expand and/or contract in accordance with expansions, contractions or other movements of the interconnection wires to which it is coupled.

As used herein, the term "flex" is intended to refer to the bending, expansion and/or contraction of an interconnect structure in accordance with an expansion, contraction or other movement of an interconnection wire or portions of a wire to which it is coupled.

As used herein, the term "wafer" is intended to refer to a semiconductor wafer that is used to form a solar cell.

Overview

The components that are used to construct photovoltaic modules can experience degradation and failure due to internal and/or external stress factors. One of the many components of photovoltaic modules that can experience degradation and failure due to internal and/or external stress factors include solar cell interconnection wires. For example, solar cell interconnection wires can experience fatigue cracking due to stress factors, such as mechanical load, temperature, etc. that can cause the movement of the solar cells to which they are connected and/or the movement of the solar cell interconnection wires themselves. The operational lifetime of photovoltaic modules can be diminished by such degradation. Consequently, manufacturers that seek to improve the operational lifetime of photovoltaic modules must use solar cell interconnection wire designs that can satisfactorily address the effect of stress factors on solar cell interconnection wires.

An interconnection wire interconnect structure for solar cells is disclosed that addresses the shortcomings of conventional interconnection wire stress relief approaches. In one embodiment, the interconnection wire interconnect structure includes a first portion that is attached to parts of a plurality of wires that extend in a first direction away from a first solar cell to which the plurality of wires are coupled and a second portion that is attached to parts of the plurality of wires that extend in a second direction away from a second solar cell to which the plurality of wires are coupled. In one embodiment, the interconnect structure includes a flexible portion between the first portion and the second portion, that includes openings, that is configured to flex in accordance with a movement of one or more of the plurality of wires.

In one embodiment, the flexing provided by the interconnect structure provides stress relief to interconnection wires that extend into spaces between adjacent solar cells. In particular, because the interconnect structure is configured to flex in accordance with stresses, fatigue cracking of wires due to stress factors, such as mechanical load, temperature, etc. can be eliminated or minimized. Moreover, because degradation and/or failure of solar cell interconnection wires can be slowed or prevented, the reliability of photovoltaic modules, or their capacity to generate power without failure over a stated period, can be improved.

Interconnection Wire Interconnect Structure with Strain Relief Features

FIG. 1A illustrates an exemplary operating environment of a photovoltaic module 160 with solar cells coupled by interconnection wires that are coupled to an interconnect structure with strain relief features according to one embodiment. FIG. 1A shows a location 150 that includes photovoltaic modules 160 that include solar cells $101_1$ and $101_2$ (portions shown unlabeled in the encircled detail view of FIG. 1A and in FIG. 1B which shows a portion of the solar cells $101_1$ and $101_2$ and an interconnection wire interconnect structure 105 that is coupled to wires $103_1$-$103_n$ that extend between the solar cells $101_1$ and $101_2$) that are connected by interconnection wires $103_1$-$103_n$ that are coupled to an interconnection wire interconnect structure 105 that is configured as described herein. In one embodiment, the solar cells $101_1$ and $101_2$ are a part of a plurality of solar cells of the photovoltaic modules 160 that generate electrons when exposed to light. In one embodiment, the photovoltaic modules 160 utilize the electrical energy generated by solar cells, such as the solar cells $101_1$ and $101_2$, to supply the location 150 with electricity that is used to power appliances 170 that are used at the location 150.

Figure 1B:
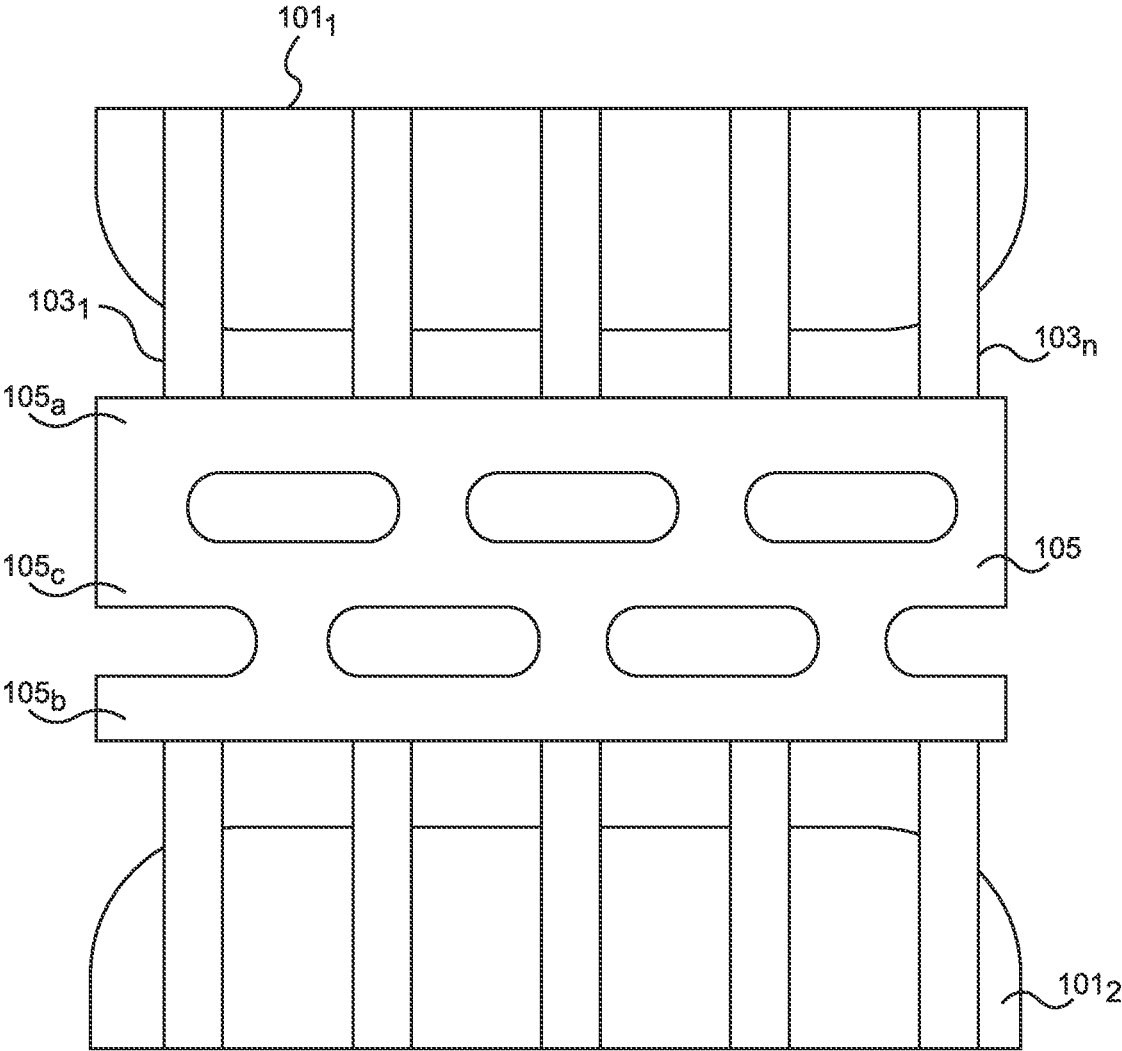
FIG. 1B shows details of a solar cell interconnection wire interconnect structure with strain relief features according to one embodiment.

Referring to FIG. 1B, the solar cells $101_1$ and $101_2$ convert energy from light directly into electricity based on the photovoltaic effect. In one embodiment, the solar cells $101_1$ and $101_2$ are coupled to the interconnection wires $103_1$-$103_n$ that receive the electricity that is generated by the solar cells $101_1$ and $101_2$ and delivers the electricity to power various devices at the location 150 or to be stored in electric power storage systems (or supplied back to the grid). In one embodiment, the solar cells $101_1$ and $101_2$ can be coupled (e.g., bonded) to the interconnection wires $103_1$-

$103_n$ by any suitable method of coupling the solar cells $101_1$ and $101_2$ to the interconnection wires $103_1$-$103_n$.

The interconnection wires $103_1$-$103_n$ are some of the many components of the photovoltaic modules 160 that can experience degradation and failure due to internal and/or external stress factors. Degradation or breakage of the interconnection wires $103_1$-$103_n$ can cause a loss of the power that the interconnection wires $103_1$-$103_n$ can deliver. In one embodiment, the interconnection wires $103_1$-$103_n$ can include a plurality of wires that extend between and across solar cells $101_1$ and $101_2$. In one embodiment, the interconnection wires $103_1$-$103_n$ can be formed from aluminum. In other embodiments, the interconnection wires $103_1$-$103_n$ can be formed from other materials. In one embodiment, the interconnection wires $103_1$-$103_n$ can be coupled to an interconnect structure 105 that flexes in accordance with stress in order to provide strain relief to the interconnection wires $103_1$-$103_n$.

In one embodiment, portions of the interconnection wires $103_1$-$103_n$ extending from the adjacent solar cells $101_1$ and $101_2$ into the area between the adjacent solar cells $101_1$ and $101_2$ are coupled to the interconnect structure 105 between the adjacent solar cells $101_1$ and $101_2$. In one embodiment, portions of the interconnection wires $103_1$-$103_n$ that extend across parts of the interconnect structure 105 are removed (to create "windows" that contribute to flexibility) prior to, or during, the positioning of the interconnect structure 105 between the adjacent solar cells $101_1$ and $101_2$. The interconnection wires $103_1$-$103_n$ that extend into the area between the adjacent solar cells $101_1$ and $101_2$ can be coupled to the interconnect structure 105 by any suitable means of coupling the interconnection wires $103_1$-$103_n$ to the interconnect structure 105.

Interconnect structure 105 includes first interconnect portion 105a, second interconnect portion 105b and flexible interconnect portion 105c. In one embodiment, the first interconnect portion 105a includes a first edge that is positioned parallel to a side of the first solar cell $101_1$, and, portions of the interconnect structure 105 that are located proximate to the first edge. In one embodiment, second interconnect portion 105b includes a second edge that is positioned parallel to the side of the second solar cell $101_2$, and, portions of the interconnect structure 105 that are located proximate to the second edge. In one embodiment, the interconnect structure 105 can include a third edge and a fourth edge, that includes portions that are perpendicular to the first edge and the second edge, and portions that are patterned, and not perpendicular to the first edge and the second edge.

In one embodiment, the flexible interconnect portion 105c is formed between the first interconnect portion 105a and the second interconnect portion 105b. In one embodiment, the flexible interconnect portion 105c is configured to be flexible or able to bend readily without breaking. In particular, the flexible interconnect portion 105c is configured to be able to flex or bend readily in accordance with stresses that can be caused by movements of the solar cells and/or interconnection wires $103_1$-$103_n$. In one embodiment, the flexible interconnect portion 105c can include openings that are located in the central portion of the interconnect structure 105. In one embodiment, the openings can be configured as "windows" that extend through the interconnect structure 105. The windows can be formed in a manner that results in the removal of the parts of the interconnection wires $103_1$-$103$ that traverse the parts of the interconnect structure 105 where the windows are formed. Thus, the interconnection wires $103_1$-$103_n$ that extend between the first solar cell $101_1$ and the second solar cell $101_2$ are interrupted by the openings.

In one embodiment, there can be a first space between the first solar cell $101_1$ and a first side of the interconnect structure 105 and a second space between the second solar cell $101_2$ and a second side of the interconnect structure 105. In one embodiment, the first space and the second space can have the same or different lengths.

Operation

In operation, referring to FIG. 1B, when light strikes the solar cells $101_1$-$101_2$ of the photovoltaic module 160 light is absorbed by the solar cells $101_1$-$101_2$. The absorption of light by the solar cells $101_1$-$101_2$ causes electrons to be freed in the solar cells $101_1$-$101_2$. In one embodiment, one or more electric fields in the solar cells $101_1$-$101_2$ force the electrons freed by light absorption to flow in a specific direction. This flow of electrons can be captured by contacts located on the top and/or bottom of the solar cells $101_1$-$101_2$. These contacts draw current from the solar cells $101_1$-$101_2$ for external use. The contacts can deliver the current to the interconnection wires $103_1$-$103_n$ that extend across the adjacent solar cells $101_1$-$101_2$ and into the space between the adjacent solar cells $101_1$-$101_2$ of the photovoltaic module 160. In one embodiment, the strain relieving action of the interconnect structure 105 that is coupled to the interconnection wires $103_1$-$103_n$ that extend into region between the adjacent solar cells $101_1$-$101_2$ minimizes loss of current due to the degradation and failure of the interconnection wires $103_1$-$103_n$.

For example, the photovoltaic modules 160 can be subjected to temperature extremes (hot and cold), e.g., day and night temperature cycles, and seasonal weather changes, that physically impact the photovoltaic modules 160. Fluctuating temperatures can cause thermal expansions and contractions in the photovoltaic modules 160 that can cause movement of the solar cells $101_1$-$101_2$. In one embodiment, in accordance with expansions and contractions, the interconnect structure 105 that is coupled to the interconnection wires $103_1$-$103_n$ that extend into the spaces between the adjacent solar cells $101_1$-$101_2$, can flex or bend in a manner that absorbs or dampens stress on the interconnection wires $103_1$-$103_n$. In addition, the interconnect structure 105 can flex or bend in accordance with stresses caused by other causes of movements of the interconnection wires $103_1$-$103_n$. Because the interconnect structure 105 is configured to flex in accordance with the stresses caused by movement of the interconnection wires $103_1$-$103_n$, strain in the interconnection wires $103_1$-$103_n$ can be relieved by the action of the interconnect structure 105 such that degradation and failure of the interconnection wires $103_1$-$103_n$ due to strain can be eliminated or minimized. In particular, because the interconnect structure 105 is configured to flex in accordance with stress, fatigue cracking due to stress factors, such as mechanical load, temperature, etc. can be eliminated or minimized.

In some cases the loss of interconnection wires, such as the interconnection wires $103_1$-$103_n$, due to wire failure can degrade the power producing capability of a photovoltaic module by 20-30 percent or more in field. In other cases the loss of interconnection wires due to wire failure can degrade the power producing capability of a photovoltaic module by other percentages in the field. For example, if 1 wire out of 100 wires is lost due to wire failure, a one percent loss of power produced by the photovoltaic module can result, or similarly if 10, 20, or more wires are lost due to wire failure, a 10, 20 or more percent loss of power produced by the photovoltaic module can result. In any case, because the expansion and contraction of the interconnection wires $103_1$-$103_n$ can cause wires to break, the operation of the interconnect structure 105 to prevent or reduce strain due to the expansion and contraction can prevent or reduce loss of the capacity of the photovoltaic module 160 to provide power.

The operation of the interconnect structures 105 can extend the operational lifetime of photovoltaic modules, e.g., 160 by addressing the effects of stress factors on the interconnection wires, e.g., $103_1$-$103_n$, of the solar cells, e.g., $101_1$-$101_2$, of photovoltaic modules, e.g., 160. Moreover, because degradation and/or failure of the solar cell interconnection wires, e.g., $103_1$-$103_n$, can be slowed or prevented, the reliability of photovoltaic modules, e.g., 160, or their capacity to generate power without failure over a stated period, can be improved.

Interconnect Structure Installation

Figures 2A, 2B, 2C:
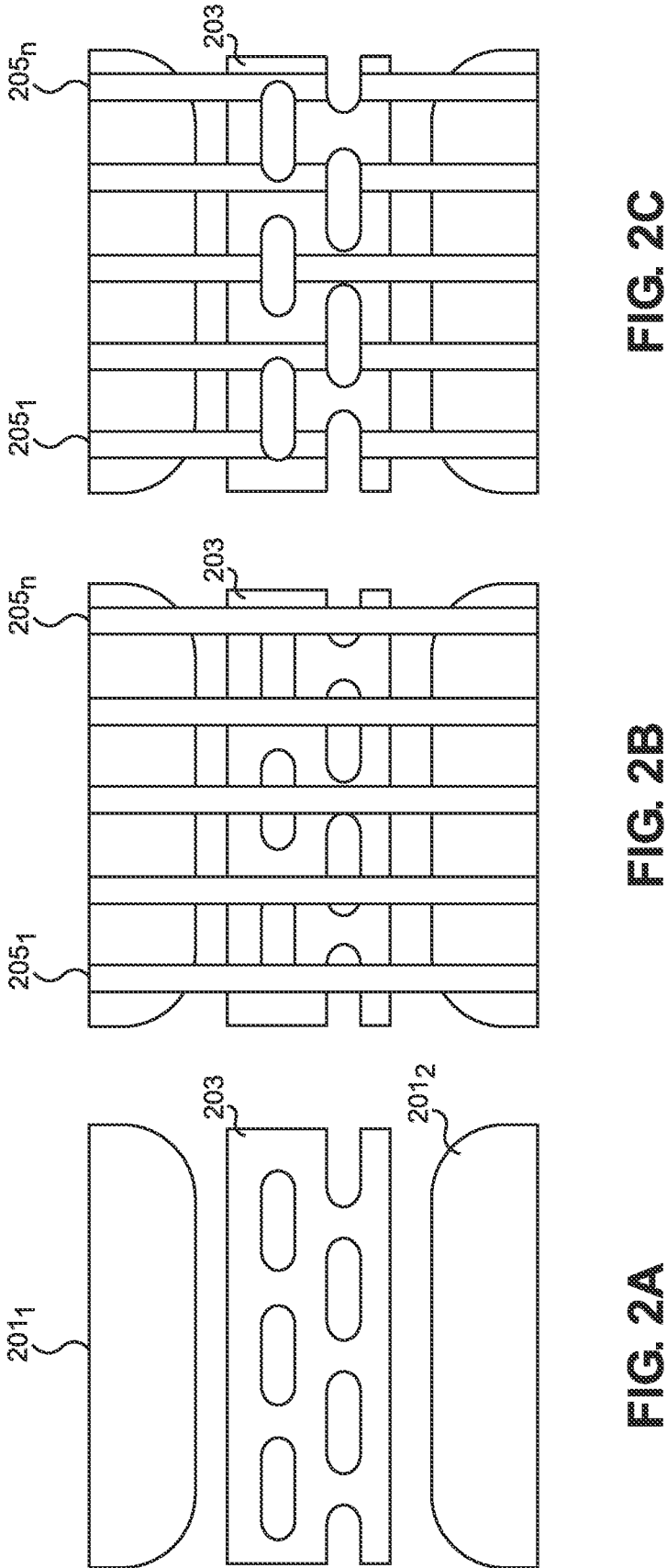
FIG. 2A shows an operation in an interconnect structure installation process where a pre-patterned interconnect structure is placed between first and second wafers before a bonding of wires to the first and second wafers is executed according to one embodiment.
FIG. 2B shows another operation in the interconnect structure installation process where a pre-patterned interconnect structure is placed between first and second wafers before a bonding of wires to the first and second wafers is executed according to one embodiment.
FIG. 2C shows another operation in the interconnect structure installation process where a pre-patterned interconnect structure is placed between first and second wafers before a bonding of wires to the first and second wafers is executed according to one embodiment.

FIGS. 2A-2C show operations in an interconnect structure installation process where a pre-patterned interconnect structure 203 is placed between a first wafer $201_1$ and a second wafer $201_2$ before the bonding of interconnection wires $205_1$-$205_n$ to the first wafer $201_1$ and the second wafer $201_2$ is executed according to one embodiment. Referring to FIG. 2A, in an initial operation, the prepatterned interconnect structure 203 is placed between the first wafer $201_1$ and the second wafer $201_2$. Referring to FIG. 2B, subsequently interconnection wires $205_1$-$205_n$ are bonded to the first wafer $201_1$, to the pre-patterned interconnect structure 203, and to the second wafer $201_2$. Referring to FIG. 2C, thereafter, excess wiring is cut out of the windows that are formed in the pre-patterned interconnect structure 203 to complete the installation process.

Figures 3A, 3B, 3C:
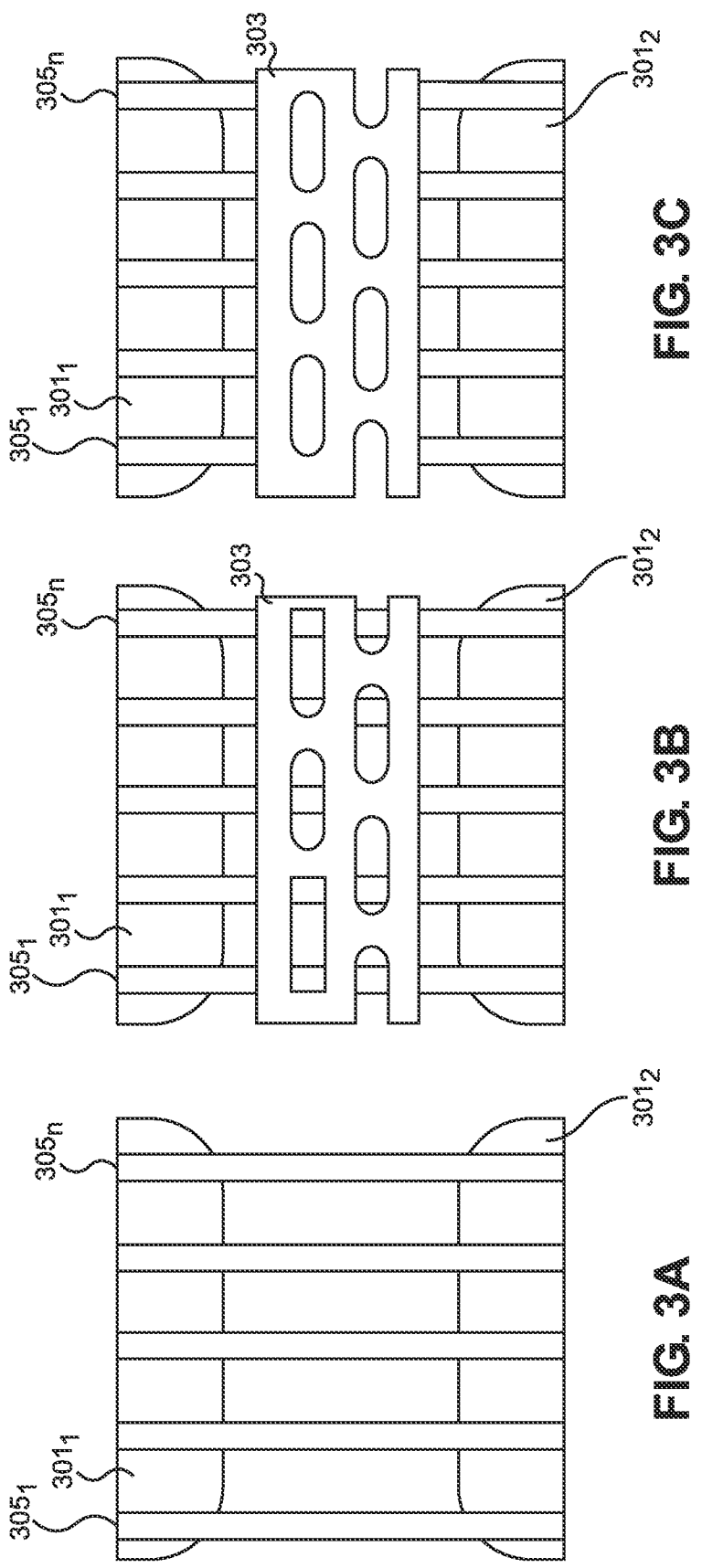
FIG. 3A shows an operation in an interconnect structure installation process where a pre-patterned interconnect structure is placed between first and second wafers after a bonding of wires to the first and second wafers is executed according to one embodiment.
FIG. 3B shows another operation in the interconnect structure installation process where a pre-patterned interconnect structure is placed between first and second wafers after a bonding of wires to the first and second wafers is executed according to one embodiment.
FIG. 3C shows another operation in the interconnect structure installation process where a pre-patterned interconnect structure is placed between first and second wafers after a bonding of wires to the first and second wafers is executed according to one embodiment.

FIGS. 3A-3C show operations in the interconnect structure installment process where a pre-patterned interconnect structure 303 is placed between a first wafer $301_1$ and a second wafer $301_2$ after the bonding of interconnection wires $305_1$-$305_n$ to the first wafer $301_1$ and the second wafer $301_2$ is executed according to one embodiment. Referring to FIG. 3A, in an initial operation, the interconnection wires $305_1$-$305_n$ are bonded to the first wafer $301_1$ and to the second wafer $301_2$. Referring to FIG. 3B, subsequently the interconnect structure 303 is bonded to the interconnection wires $305_1$-$305_n$. Referring to FIG. 3C, thereafter excess wiring is cut out of the windows that are formed in the pre-patterned interconnect structure 303.

Figures 4A, 4B, 4C:
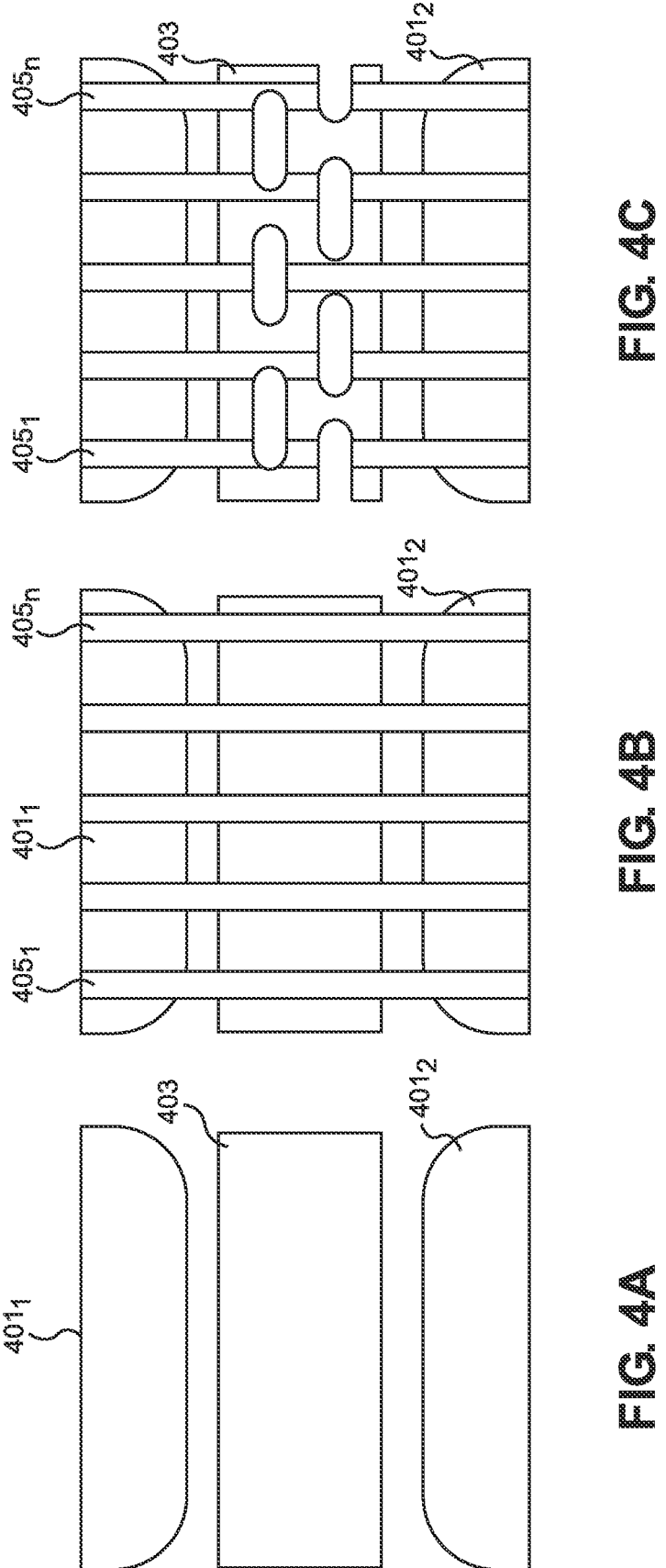
FIG. 4A shows an operation in an interconnect structure installation process where an un-patterned interconnect structure is placed between first and second wafers before a bonding of wires to the first and second wafers is executed according to one embodiment.
FIG. 4B shows another operation in the interconnect structure installation process where an un-patterned interconnect structure is placed between first and second wafers before a bonding of wires to the first and second wafers is executed according to one embodiment.
FIG. 4C shows another operation in the interconnect structure installation process where an un-patterned interconnect structure is placed between first and second wafers before a bonding of wires to the first and second wafers is executed according to one embodiment.

FIGS. 4A-4C show operations in the interconnect structure installment process where an un-patterned interconnect structure 403 is placed between a first wafer $401_1$ and a second wafer $401_2$ before interconnection wires $405_1$-$405_n$ are bonded to the first wafer $401_1$ and the second wafer $401_2$ according to one embodiment. Referring to FIG. 4A, in an initial operation, an un-patterned interconnect structure 403 is placed between a first wafer $401_1$ and a second wafer $401_2$. Referring to FIG. 4B, subsequently the interconnection wires $405_1$-$405_n$ are bonded to the first wafer $401_1$, to the un-patterned interconnect structure 403, and to the second wafer $401_2$. Referring to FIG. 4C, thereafter, strain relief windows and excess wiring formed over places where the strain relief windows are to be formed are cut such that strain relief windows are formed in the un-patterned interconnect structure 403.

Figures 5A, 5B, 5C:
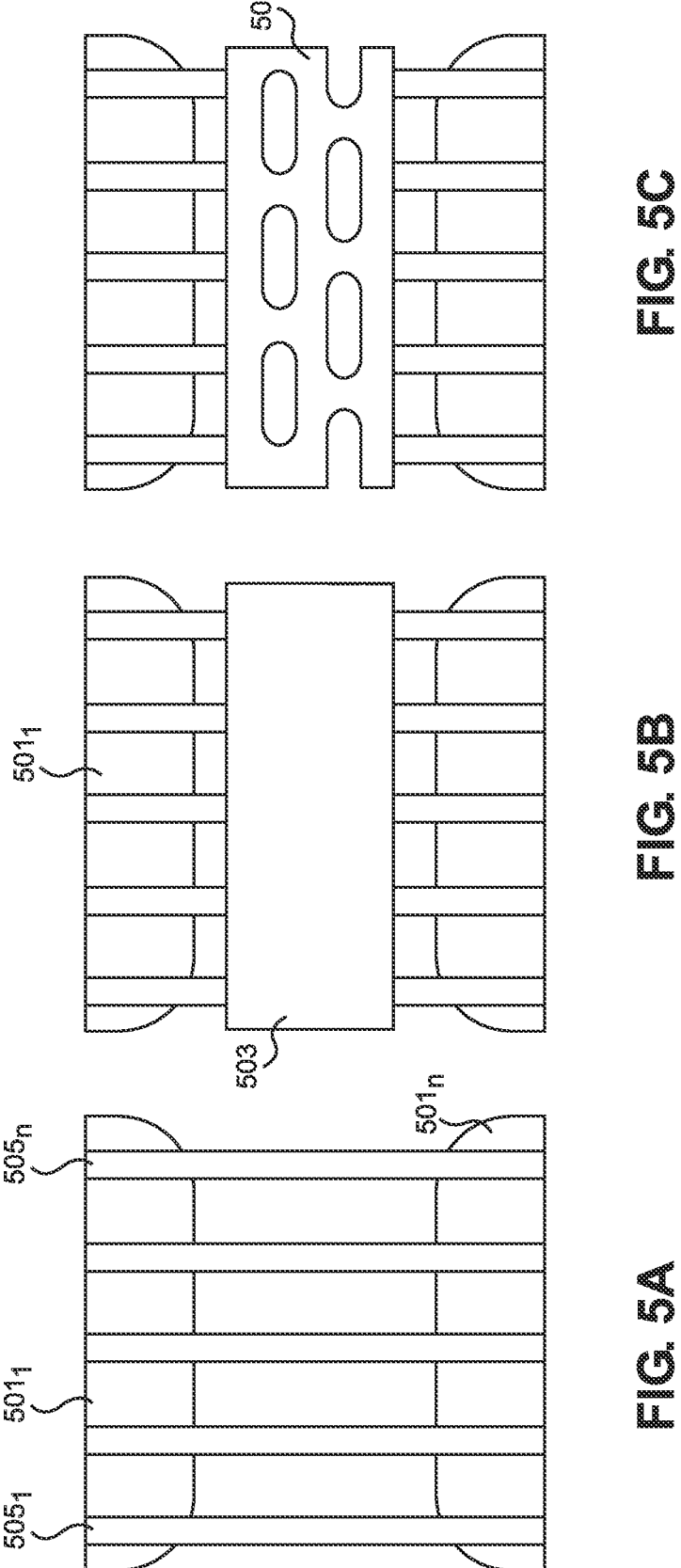
FIG. 5A shows an operation in an interconnect structure installation process where an un-patterned interconnect structure is placed between first and second wafers after bonding of wires to the first and second wafers is executed according to one embodiment.
FIG. 5B shows another operation in the interconnect structure installation process where an un-patterned interconnect structure is placed between first and second wafers after bonding of wires to the first and second wafers is executed according to one embodiment.
FIG. 5C shows another operation in the interconnect structure installation process where an un-patterned interconnect structure is placed between first and second wafers after bonding of wires to the first and second wafers is executed according to one embodiment.

FIGS. 5A-5C show operations in the interconnect structure installment process where an un-patterned interconnect structure 503 is placed between a first wafer $501_1$ and a second wafer $501_2$ after interconnection wires $505_1$-$505_n$ are bonded to the first wafer $501_1$ and the second wafer $501_2$ according to one embodiment. Referring to FIG. 5A, in an initial operation, the interconnection wires $505_1$-$505_n$ are bonded to the first wafer $501_1$ and to the second wafer $501_2$. Referring to FIG. 5B, subsequently, the un-patterned interconnect structure 503 is bonded to the top of the interconnection wires $505_1$-$505_n$. Referring to FIG. 5C, thereafter, strain relief windows and excess wiring that is formed underneath places where the strain relief windows are to be formed in the un-patterned interconnect structure 503 are cut such that unobstructed strain relief windows are formed in the un-patterned interconnect structure 503.

Strain Relief Features

Figures 6A, 6B, 6C, 6D:
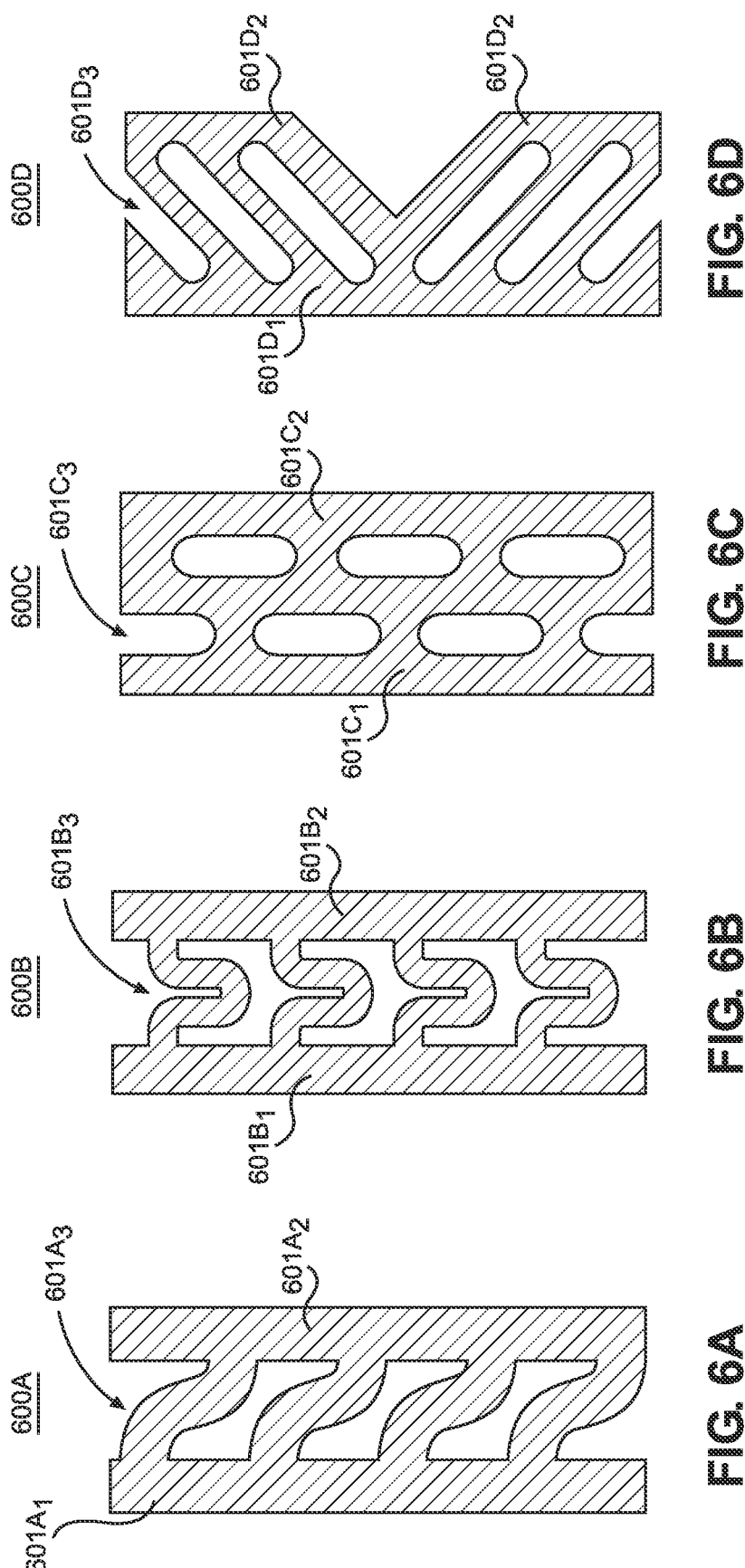
FIG. 6A shows an interconnection wire interconnect structure that includes a plurality of flexible components that include a first part that curves downward from their attachment to a first side of the interconnect structure and upward from their attachment to a second side of the interconnect structure according to one embodiment.
FIG. 6B shows an interconnection wire interconnect structure that includes a plurality of flexible components that include a u-bend according to one embodiment.
FIG. 6C shows an interconnection wire interconnect structure that includes a flexible component that includes first and second parallel sets of vertically aligned windows according to one embodiment.
FIG. 6D shows an interconnection wire interconnect structure that includes a flexible component that includes a first and a second plurality of diagonally oriented oblong windows according to one embodiment.

FIGS. 6A-6D shows interconnect structures 600A-600D that have various configurations according to one embodiment. FIG. 6A shows an interconnect structure 600A that includes a flexible component $601A_3$, that includes a plurality of "S-bend" structures, that include a first part that curves downward from an attachment to a first component $601A_1$ of the interconnect structure 600A that has a vertically extending rectangular shape (e.g., the vertically extending ribbon on the left) and a second part that curves upward from an attachment to a second component $601A_2$ of the interconnect structure 600A that has a vertically extending rectangular shape (e.g., the vertically extending ribbon on the right).

FIG. 6B shows an interconnect structure 600B that includes a plurality of flexible components $601B_3$ that include a u-bend with first and second upper portions that extend laterally to form attachments respectively to a first component $601B_1$ (e.g., the vertically extending ribbon on the right) of the interconnect structure 600B and a second component $601B_2$. (e.g., the vertically extending ribbon on the right) of the interconnect structure 600B.

FIG. 6C shows an interconnect structure 600C that includes a flexible component $601C_3$ that includes first (left) and second (right) parallel sets of vertically aligned windows where the windows in the second set of vertically aligned windows are centered with respect to spaces lying between windows in the first set of vertically aligned windows. In one embodiment, interconnect structure 600C also includes a first component $601C_1$ (e.g., the left side edge and proximate area) of the interconnect structure 600C and a second component $601C_2$. (e.g., the right side edge and proximate area) of the interconnect structure 600C.

FIG. 6D shows an interconnect structure 600D that includes a flexible component $601D_3$ that includes a first and a second plurality of diagonally oriented oblong windows. The first plurality of diagonally oriented oblong windows extend diagonally upward from a first component $601D_1$ of the interconnect structure 600D toward a second component $601D_2$ of the interconnect structure 600D. And the second plurality of oblong windows extend diagonally downward from the first component $601D_1$ of the interconnect structure 600D toward the second component $601D_2$ of the interconnect structure 600D. In one embodiment, a rightward oriented v-shaped space is formed in the second component $601D_2$ of the interconnect structure 600D between the upward oriented first plurality of diagonally oriented oblong windows and the downward oriented second plurality of diagonally oriented oblong windows.

Method for Forming Interconnect Structure

FIG. 7 shows a flowchart of a method for forming an interconnect structure for solar cell interconnection wires according to one embodiment. At 701, forming a first portion that is attached to parts of a plurality of interconnection wires that extend in a first direction away from a first solar cell to which the plurality of interconnection wires are coupled. At 703, forming a second portion that is attached to parts of the plurality of interconnection wires that extend in a second direction away from a second solar cell to which the plurality of interconnection wires are coupled. And, at 705 forming a flexible portion between the first portion and the second portion, that includes openings, that is configured to flex in accordance with a movement of one or more of the plurality of interconnection wires.

In one embodiment, there is a first space between the first solar cell and a first side of the interconnect structure and a second space between the second solar cell and a second side of the interconnect structure. In one embodiment, the first portion includes a first side edge, and the second portion includes a second side edge. In one embodiment, the interconnect structure includes a third side edge that includes portions that are, and portions that are not, perpendicular to the first side edge; and a fourth side edge that includes portions that are, and portions that are not, perpendicular to the second side edge. In one embodiment, the plurality of wires include an odd number of wires that are coupled to one or more back contacts.

In one embodiment, when an odd number of wires/ regions is used all wires of one polarity on a first wafer, can be connected to all wires of the opposite polarity on a second wafer. Moreover, in one embodiment, when an odd number of wires/regions is used, p fingers can be placed at the edge regions of a cell instead of n. By placing p fingers at the edge regions of the cell instead of n, the collection efficiency of minority carriers can be increased for the edge regions. For highest efficiency, it is beneficial to collect as many minority carriers (holes) as possible from the semiconductor before the minority carriers have a chance to recombine. By minimizing the distance that a photo-generated carrier must travel before reaching a collecting contact (by placing p fingers at the edge regions of the cell), the chance of recombination can be minimized, and more current can be extracted from the cell. In one embodiment, by structuring solar cells in this manner, the overall efficiency of a solar cell can be increased.

In one embodiment, each of the plurality of wires is coupled to an interdigitated finger. In one embodiment, the openings are in a central portion of the interconnect structure and include spaces that are untraversed by the plurality of wires.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure. The scope of the present disclosure includes any feature or combination of features disclosed herein (either explicitly or implicitly), or any generalization thereof, whether or not it mitigates any or all of the problems addressed herein. Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The various features of the different embodiments may be variously combined with some features included and others excluded to suit a variety of different applications.

What is claimed is:

1. An interconnect structure for solar cell interconnection wires, comprising:
   a first portion that is attached to parts of a plurality of interconnection wires that extend in a first direction away from a first solar cell to which the plurality of interconnection wires are coupled;
   a second portion that is attached to parts of the plurality of interconnection wires that extend in a second direction away from a second solar cell to which the plurality of interconnection wires are coupled; and
   a flexible portion between the first portion and the second portion, that includes openings, that is configured to flex in accordance with a movement of one or more of the plurality of interconnection wires.

2. The interconnect structure for solar cell interconnection wires of claim 1, wherein there is a first space between the first solar cell and a first side of the interconnect structure and a second space between the second solar cell and a second side of the interconnect structure.

3. The interconnect structure for solar cell interconnection wires of claim 1, wherein the first portion includes a first side edge, and the second portion includes a second side edge.

4. The interconnect structure for the solar cell interconnection wires of claim 3, further comprising:
   a third side edge that includes portions that are, and portions that are not, perpendicular to the first side edge; and
   a fourth side edge that includes portions that are, and portions that are not, perpendicular to the second side edge.

5. The interconnect structure for the solar cell interconnection wires of claim 1, wherein the plurality of interconnection wires include an odd number of interconnection wires that are coupled to one or more back contacts.

6. The interconnect structure for the solar cell interconnection wires of claim 1, wherein each of the plurality of interconnection wires is coupled to an interdigitated finger.

7. The interconnect structure for the solar cell interconnection wires of claim 1, wherein the openings are in a central portion of the interconnect structure and include spaces that are untraversed by the plurality of interconnection wires.

8. A photovoltaic module, comprising:
   a plurality of solar cells;
   a plurality of interconnection wires coupled to the plurality of solar cells; and
   a plurality of interconnect structures for the plurality of interconnection wires coupled to the plurality of interconnection wires, the plurality of interconnect structures comprising:
   a first portion that is attached to parts of the plurality of interconnection wires that extend in a first direction away from a first solar cell to which the plurality of interconnection wires are coupled;
   a second portion that is attached to parts of the plurality of interconnection wires that extend in a second direction away from a second solar cell to which the plurality of interconnection wires are coupled; and
   a flexible portion between the first portion and the second portion, that includes openings, that is configured to flex in accordance with a movement of one or more of the plurality of interconnection wires.

9. The photovoltaic module of claim 8, wherein there is a first space between the first solar cell and a first side of the interconnect structure and a second space between the second solar cell and a second side of the interconnect structure.

10. The photovoltaic module of claim 8, wherein the first portion includes a first side edge, and the second portion includes a second side edge.

11. The photovoltaic module of claim 10, further comprising:

a third side edge that includes portions that are, and portions that are not, perpendicular to the first side edge; and a fourth side edge that includes portions that are, and portions that are not, perpendicular to the second side edge.

12. The photovoltaic module of claim 8, wherein the plurality of interconnection wires include an odd number of interconnection wires that are coupled to one or more back contacts.

13. The photovoltaic module of claim 8, wherein each of the plurality of interconnection wires is coupled to an interdigitated finger.

14. The photovoltaic module of claim 8, wherein the openings are in a central portion of the interconnect structure and include spaces that are untraversed by the plurality of interconnection wires.

\* \* \* \* \*